United States Patent
Zhou et al.

(10) Patent No.: US 8,975,170 B2
(45) Date of Patent: Mar. 10, 2015

(54) DOPANT INK COMPOSITIONS FOR FORMING DOPED REGIONS IN SEMICONDUCTOR SUBSTRATES, AND METHODS FOR FABRICATING DOPANT INK COMPOSITIONS

(75) Inventors: Ligui Zhou, Saratoga, CA (US); Richard A. Spear, Santa Cruz, CA (US); Roger Yu-Kwan Leung, San Jose, CA (US); Wenya Fan, Campbell, CA (US); Helen X. Xu, Sunnyvale, CA (US); Lea M. Metin, San Jose, CA (US); Anil Shriram Bhanap, Milpitas, CA (US)

(73) Assignee: Honeywell International Inc., Morristown, NJ (US)

( * ) Notice: Subject to any disclaimer, the term of this patent is extended or adjusted under 35 U.S.C. 154(b) by 721 days.

(21) Appl. No.: 13/280,077

(22) Filed: Oct. 24, 2011

(65) Prior Publication Data

US 2013/0098266 A1    Apr. 25, 2013

(51) Int. Cl.
*H01L 21/22*    (2006.01)
*C09D 11/03*    (2014.01)
*C09D 11/38*    (2014.01)
*C09D 11/52*    (2014.01)

(52) U.S. Cl.
CPC ............ *H01L 21/2225* (2013.01); *C09D 11/03* (2013.01); *C09D 11/38* (2013.01); *C09D 11/52* (2013.01)
USPC .... 438/542; 438/562; 106/287.1; 106/287.29

(58) Field of Classification Search
CPC ....... H01L 21/22; H01L 21/225; H01L 21/38; H01L 21/385
USPC .................. 438/542, 562; 106/287.1, 287.29
See application file for complete search history.

(56) References Cited

U.S. PATENT DOCUMENTS

| | | |
|---|---|---|
| 3,258,434 A | 6/1966 | Mackenzie et al. |
| 3,725,149 A | 4/1973 | Ilegems |
| 3,877,956 A | 4/1975 | Nitzche et al. |
| 3,960,605 A | 6/1976 | Beck et al. |
| 4,030,938 A | 6/1977 | Thomas |
| 4,072,636 A | 2/1978 | Ashida et al. |
| 4,102,766 A | 7/1978 | Fey |
| 4,104,091 A | 8/1978 | Evans, Jr. et al. |
| 4,236,948 A | 12/1980 | Seibold et al. |
| 4,243,427 A | 1/1981 | DiBugnara |
| 4,392,180 A | 7/1983 | Nair |
| 4,478,879 A | 10/1984 | Baraona et al. |
| 4,517,403 A | 5/1985 | Morel et al. |
| 4,548,741 A | 10/1985 | Hormadaly |
| 4,578,283 A | 3/1986 | Kirtley et al. |
| 4,707,346 A | 11/1987 | Hormadaly |
| 4,793,862 A | 12/1988 | Ishikawa et al. |
| 4,891,331 A | 1/1990 | Rapp |
| 4,927,770 A | 5/1990 | Swanson |
| 5,053,083 A | 10/1991 | Sinton |
| 5,152,819 A | 10/1992 | Blackwell et al. |
| 5,302,198 A | 4/1994 | Allman |
| 5,399,185 A | 3/1995 | Berthold et al. |
| 5,464,564 A | 11/1995 | Brown |
| 5,472,488 A | 12/1995 | Allman |
| 5,510,271 A | 4/1996 | Rohatgi et al. |
| 5,527,389 A | 6/1996 | Rosenblum et al. |
| 5,527,872 A | 6/1996 | Allman |
| 5,591,565 A | 1/1997 | Holdermann et al. |
| 5,614,018 A | 3/1997 | Azuma et al. |
| 5,641,362 A | 6/1997 | Meier |
| 5,661,041 A | 8/1997 | Kano |
| 5,667,597 A | 9/1997 | Ishihara |
| 5,695,809 A | 12/1997 | Chadha et al. |
| 5,766,964 A | 6/1998 | Rohatgi et al. |
| 5,899,704 A | 5/1999 | Schlosser et al. |
| 5,928,438 A | 7/1999 | Salami et al. |
| 6,096,968 A | 8/2000 | Schlosser et al. |
| 6,099,647 A | 8/2000 | Yieh et al. |
| 6,143,976 A | 11/2000 | Endros |
| 6,162,658 A | 12/2000 | Green et al. |
| 6,180,869 B1 | 1/2001 | Meier et al. |
| 6,200,680 B1 | 3/2001 | Takeda et al. |
| 6,221,719 B1 | 4/2001 | Franco |
| 6,232,207 B1 | 5/2001 | Schindler |
| 6,251,756 B1 | 6/2001 | Horzel et al. |

(Continued)

FOREIGN PATENT DOCUMENTS

| | | |
|---|---|---|
| CN | 101369612 | 2/2009 |
| CN | 101414647 A | 4/2009 |

(Continued)

OTHER PUBLICATIONS

Written Opinion and International Search Report mailed Feb. 23, 2013 in International Application No. PCT/US2012/051719.
Written Opinion and International Search Report mailed Mar. 25, 2013 in International Application No. PCT/US2012/059847.
Horzel, J., "A simple processing sequence for selective emitters (Si solar cells]," Photovoltaic Specialists Conference, 1997, Conference Record of the Twenty-Sixth IEEE; Sep. 29-Oct. 3, 1997; pp. 139-142; Meeting Date: Sep. 29, 1997-Oct. 3, 1997.
Accuglass P-114A Spin-On Glass, Material Safety Data Sheet, HW International, Oct. 29, 2003, pp. 1-6.
Accuglass P-5S, Product Bulletin, Thin-Film Dielectrics, HW International, 2002, pp. 1-2.
Accuglass P-TTY A series Phosphosilicate Spin-On Glasses, Allied Signal, Inc. Planarization and Diffusion Products, May 1992, pp. 1-2.
Accuglass P-TTY Product Bulletin, Thin-Film Dielectrics, HW International, 2002, pp. 1-2.
Accuglass P-XXY Spin-On Glass, Material Safety Data Sheet, HW International, May 14, 2003, pp. 1-7.

(Continued)

*Primary Examiner* — Mark Kopec
*Assistant Examiner* — Haidung Nguyen
(74) *Attorney, Agent, or Firm* — Ingrassia Fisher & Lorenz PC

(57) ABSTRACT

Dopant ink compositions for forming doped regions in semiconductor substrates and methods for fabricating dopant ink compositions are provided. In an exemplary embodiment, a dopant ink composition comprises a dopant compound including at least one alkyl group bonded to a Group 13 element or a Group 15 element. Further, the dopant ink composition includes a silicon-containing compound.

18 Claims, 6 Drawing Sheets

(56) References Cited

U.S. PATENT DOCUMENTS

| | | |
|---|---|---|
| 6,262,359 B1 | 7/2001 | Meier et al. |
| 6,297,134 B1 | 10/2001 | Ui et al. |
| 6,300,267 B1 | 10/2001 | Chen et al. |
| 6,309,060 B1 | 10/2001 | Timmermans-Wang et al. |
| 6,355,581 B1 | 3/2002 | Vassiliev et al. |
| 6,384,317 B1 | 5/2002 | Kerschaver et al. |
| 6,429,037 B1 | 8/2002 | Wenham et al. |
| 6,479,885 B2 | 11/2002 | Buchanan et al. |
| 6,518,087 B1 | 2/2003 | Furusawa et al. |
| 6,524,880 B2 | 2/2003 | Moon et al. |
| 6,552,414 B1 | 4/2003 | Horzel et al. |
| 6,632,730 B1 | 10/2003 | Meier et al. |
| 6,664,631 B2 | 12/2003 | Meier et al. |
| 6,695,903 B1 | 2/2004 | Kubelbeck et al. |
| 6,703,295 B2 | 3/2004 | Meier et al. |
| 6,737,340 B2 | 5/2004 | Meier et al. |
| 6,756,290 B1 | 6/2004 | Bultman |
| 6,773,994 B2 | 8/2004 | Chittipeddi et al. |
| 6,784,520 B2 | 8/2004 | Doi |
| 6,825,104 B2 | 11/2004 | Horzel et al. |
| 6,960,546 B2 | 11/2005 | Caspers et al. |
| 6,998,288 B1 | 2/2006 | Smith et al. |
| 7,029,943 B2 | 4/2006 | Kruhler |
| 7,041,549 B2 | 5/2006 | Ootsuka |
| 7,078,276 B1 | 7/2006 | Zurcher et al. |
| 7,078,324 B2 | 7/2006 | Dudek et al. |
| 7,097,788 B2 | 8/2006 | Kirkor et al. |
| 7,108,733 B2 | 9/2006 | Enokido |
| 7,115,216 B2 | 10/2006 | Carter et al. |
| 7,129,109 B2 | 10/2006 | Munzer et al. |
| 7,135,350 B1 | 11/2006 | Smith et al. |
| 7,144,751 B2 | 12/2006 | Gee et al. |
| 7,170,001 B2 | 1/2007 | Gee et al. |
| 7,186,358 B2 | 3/2007 | McCulloch et al. |
| 7,196,018 B2 | 3/2007 | Szlufcik et al. |
| 7,217,883 B2 | 5/2007 | Munzer |
| 7,278,728 B2 | 10/2007 | Desie et al. |
| 7,332,445 B2 | 2/2008 | Lukas et al. |
| 7,335,555 B2 | 2/2008 | Gee et al. |
| 7,393,464 B2 | 7/2008 | Wenderoth et al. |
| 7,393,723 B2 | 7/2008 | Yamazaki et al. |
| 7,402,448 B2 | 7/2008 | Narayanan et al. |
| 7,456,084 B2 | 11/2008 | Jonczyk et al. |
| 7,468,485 B1 | 12/2008 | Swanson |
| 7,537,951 B2 | 5/2009 | Gambino et al. |
| 7,559,494 B1 | 7/2009 | Yadav et al. |
| 7,572,740 B2 | 8/2009 | Terry et al. |
| 7,615,393 B1 | 11/2009 | Shah et al. |
| 7,633,006 B1 | 12/2009 | Swanson |
| 7,635,600 B2 | 12/2009 | Zhang et al. |
| 7,638,438 B2 | 12/2009 | Eldershaw |
| 7,867,960 B2 | 1/2011 | Yamaguchi et al. |
| 8,053,867 B2 | 11/2011 | Huang et al. |
| 8,138,070 B2 | 3/2012 | Kelman et al. |
| 2002/0046765 A1 | 4/2002 | Uematsu et al. |
| 2002/0153039 A1 | 10/2002 | Moon et al. |
| 2003/0134469 A1 | 7/2003 | Horzel et al. |
| 2003/0153141 A1 | 8/2003 | Carter et al. |
| 2004/0028971 A1 | 2/2004 | Wenderoth et al. |
| 2004/0063326 A1 | 4/2004 | Szlufcik et al. |
| 2004/0112426 A1 | 6/2004 | Hagino |
| 2004/0242019 A1 | 12/2004 | Klein et al. |
| 2004/0261839 A1 | 12/2004 | Gee et al. |
| 2004/0261840 A1 | 12/2004 | Schmidt et al. |
| 2005/0014359 A1 | 1/2005 | Segawa et al. |
| 2005/0189015 A1 | 9/2005 | Rohatgi et al. |
| 2005/0190245 A1 | 9/2005 | Desie et al. |
| 2005/0268963 A1 | 12/2005 | Jordan et al. |
| 2006/0060238 A1 | 3/2006 | Hacke et al. |
| 2006/0105581 A1 | 5/2006 | Bielfeld et al. |
| 2006/0162766 A1 | 7/2006 | Gee et al. |
| 2006/0163744 A1 | 7/2006 | Vanheusden et al. |
| 2006/0166429 A1 | 7/2006 | Chaudhry et al. |
| 2006/0222869 A1 | 10/2006 | Cai et al. |
| 2006/0237719 A1 | 10/2006 | Colfer et al. |
| 2006/0258820 A1 | 11/2006 | Schneider |
| 2007/0012355 A1 | 1/2007 | LoCascio et al. |
| 2007/0034251 A1 | 2/2007 | Jonczyk et al. |
| 2007/0075416 A1 | 4/2007 | Anderson et al. |
| 2007/0151598 A1 | 7/2007 | De Ceuster et al. |
| 2007/0157965 A1 | 7/2007 | Park |
| 2007/0215203 A1 | 9/2007 | Ishikawa et al. |
| 2007/0269923 A1 | 11/2007 | Lee et al. |
| 2007/0290283 A1 | 12/2007 | Park et al. |
| 2008/0026550 A1 | 1/2008 | Werner et al. |
| 2008/0036799 A1 | 2/2008 | Ittel |
| 2008/0042212 A1 | 2/2008 | Kamath et al. |
| 2008/0044964 A1 | 2/2008 | Kamath et al. |
| 2008/0048240 A1 | 2/2008 | Kamath et al. |
| 2008/0058231 A1 | 3/2008 | Yamaguchi et al. |
| 2008/0058232 A1 | 3/2008 | Yamaguchi et al. |
| 2008/0064813 A1 | 3/2008 | Schneider |
| 2008/0076240 A1 | 3/2008 | Veschetti et al. |
| 2008/0092944 A1 | 4/2008 | Rubin |
| 2008/0107814 A1 | 5/2008 | Wierer et al. |
| 2008/0107815 A1 | 5/2008 | Schneider et al. |
| 2008/0121279 A1 | 5/2008 | Swanson |
| 2008/0138456 A1 | 6/2008 | Fork et al. |
| 2008/0142075 A1 | 6/2008 | Reddy et al. |
| 2008/0160733 A1 | 7/2008 | Hieslmair et al. |
| 2008/0199687 A1 | 8/2008 | Chiruvolu et al. |
| 2008/0202576 A1 | 8/2008 | Hieslmair |
| 2008/0210298 A1 | 9/2008 | Kuebelbeck et al. |
| 2008/0241986 A1 | 10/2008 | Rohatgi et al. |
| 2008/0241987 A1 | 10/2008 | Rohatgi et al. |
| 2008/0241988 A1 | 10/2008 | Rohatgi et al. |
| 2008/0251121 A1 | 10/2008 | Stone |
| 2008/0264332 A1 | 10/2008 | Sepehry-Fard |
| 2008/0268584 A1 | 10/2008 | Anderson et al. |
| 2008/0290368 A1 | 11/2008 | Rubin |
| 2008/0314288 A1 | 12/2008 | Biro et al. |
| 2009/0007962 A1 | 1/2009 | Wenham et al. |
| 2009/0007965 A1 | 1/2009 | Rohatgi et al. |
| 2009/0017606 A1 | 1/2009 | Fath et al. |
| 2009/0020156 A1 | 1/2009 | Ohtsuka et al. |
| 2009/0020829 A1 | 1/2009 | Chandra et al. |
| 2009/0068474 A1 | 3/2009 | Lower et al. |
| 2009/0068783 A1 | 3/2009 | Borden |
| 2009/0084440 A1 | 4/2009 | Wang et al. |
| 2009/0142875 A1 | 6/2009 | Borden et al. |
| 2009/0142911 A1 | 6/2009 | Asano et al. |
| 2009/0183768 A1 | 7/2009 | Wenham et al. |
| 2009/0194153 A1 | 8/2009 | Hilali et al. |
| 2009/0226609 A1 | 9/2009 | Boisvert et al. |
| 2009/0227061 A1 | 9/2009 | Bateman et al. |
| 2009/0227097 A1 | 9/2009 | Bateman et al. |
| 2009/0233426 A1 | 9/2009 | Poplavskyy et al. |
| 2009/0239330 A1 | 9/2009 | Vanheusden et al. |
| 2009/0239363 A1 | 9/2009 | Leung et al. |
| 2009/0260684 A1 | 10/2009 | You |
| 2009/0292053 A1 | 11/2009 | Morita |
| 2009/0308440 A1 | 12/2009 | Adibi et al. |
| 2009/0314341 A1 | 12/2009 | Borden et al. |
| 2009/0314344 A1 | 12/2009 | Fork et al. |
| 2010/0016200 A1 | 1/2010 | Nagare et al. |
| 2010/0068848 A1 | 3/2010 | Kuo et al. |
| 2010/0261347 A1 | 10/2010 | Nobutoh |
| 2010/0319771 A1 | 12/2010 | Mihailetchi et al. |
| 2011/0017291 A1* | 1/2011 | Morita et al. ................ 136/256 |
| 2011/0021012 A1 | 1/2011 | Leung et al. |
| 2011/0021736 A1 | 1/2011 | Zhu |
| 2011/0045624 A1 | 2/2011 | Tsukigata et al. |
| 2011/0195541 A1 | 8/2011 | Machii et al. |
| 2011/0240997 A1 | 10/2011 | Rockenberger et al. |
| 2011/0256658 A1 | 10/2011 | Machii et al. |
| 2012/0006393 A1 | 1/2012 | Cruz et al. |
| 2012/0048356 A1 | 3/2012 | Jee et al. |
| 2012/0222734 A1 | 9/2012 | Kano et al. |

FOREIGN PATENT DOCUMENTS

| | | |
|---|---|---|
| CN | 101777606 A | 7/2010 |
| CN | 101937940 A | 1/2011 |
| CN | 102097525 A | 6/2011 |

(56) References Cited

FOREIGN PATENT DOCUMENTS

| | | |
|---|---|---|
| CN | 102057466 A | 11/2011 |
| CN | 102263159 A | 11/2011 |
| EP | 0195148 A1 | 9/1986 |
| EP | 0381430 A2 | 1/1990 |
| EP | 485122 A1 | 5/1992 |
| EP | 0339385 B1 | 9/1994 |
| EP | 0890980 A2 | 1/1999 |
| EP | 999598 A1 | 5/2000 |
| EP | 1024523 A1 | 8/2000 |
| EP | 0770265 B1 | 3/2002 |
| EP | 1843389 A1 | 10/2007 |
| EP | 1876651 A1 | 1/2008 |
| GB | 1250585 | 10/1971 |
| JP | 09036853 A | 11/1997 |
| JP | 2003188393 A | 4/2003 |
| JP | 2003168807 | 6/2003 |
| JP | 2003168810 | 6/2003 |
| JP | 2003188393 A | 7/2003 |
| JP | 2003224285 | 8/2003 |
| JP | 2004221149 | 8/2004 |
| JP | 2005038997 | 2/2005 |
| JP | 2007081300 | 3/2007 |
| JP | 2011187894 A2 | 9/2011 |
| KR | 10-1989-0016644 A | 11/1989 |
| KR | 19990066346 A1 | 8/1999 |
| KR | 10-0697439 B1 | 3/2007 |
| KR | 101165915 B1 | 7/2012 |
| WO | 9715075 | 4/1997 |
| WO | 2006029250 A2 | 3/2006 |
| WO | 2006131251 A1 | 12/2006 |
| WO | 2007059577 A1 | 5/2007 |
| WO | 2007059578 A1 | 5/2007 |
| WO | 2007106502 A2 | 9/2007 |
| WO | 2007111996 A2 | 10/2007 |
| WO | 2007118121 A2 | 10/2007 |
| WO | 2007129966 A1 | 11/2007 |
| WO | 2008039078 A2 | 4/2008 |
| WO | 2008054473 A2 | 5/2008 |
| WO | 2008085806 A1 | 7/2008 |
| WO | 2008098407 A1 | 8/2008 |
| WO | 2008141415 A2 | 11/2008 |
| WO | 2009010585 A2 | 1/2009 |
| WO | 2009013307 A2 | 1/2009 |
| WO | 2009032359 A2 | 3/2009 |
| WO | 2009052511 A2 | 4/2009 |
| WO | 2009067005 A1 | 5/2009 |
| WO | 2009085224 A2 | 7/2009 |
| WO | 2009088138 A1 | 7/2009 |
| WO | 2009094575 A2 | 7/2009 |
| WO | 2009107920 A1 | 9/2009 |
| WO | 2009116569 A1 | 9/2009 |
| WO | 2009126803 A2 | 10/2009 |
| WO | 2009152378 A1 | 12/2009 |
| WO | 2010089654 A1 | 8/2010 |

OTHER PUBLICATIONS

Diffusion Technology Phosphorus Spin-On Dopants P-8 Series (P-8545, P-854 (:1), Material Safety Data Sheet, HW International, Apr. 25, 2003, p. 1-7.
Techniglas Technical Products, Boron Plus, Product Information. pp. 1-3, 2008.
BoronPlus, High Purity Planar Dopants, ISO Certified 3002/14001, Techneglas Technical Products, 2000.
Zable, J.L., Splatter During Ink Jet Printing, IBM J. Res. Develop., Jul. 1977, pp. 315-320.
B-30, B-40, B-50, B-60 Spin-On Dopants, Material Safety Data Sheet, Honeywell International, Apr. 29, 2003, pp. 1-7.
Accuspin Boron; Polymers for All P-Type Diffusion, Honeywell International, 2005, pp. 1-2.
Spin-On Dopants, Thin Film-Dielectrics, Application Comparision, Honeywell International, 2002, pp. 1-2.
Tonooka, K., et al., "Fluorescent Properties of Tb-doped Borosilicate Glass Films Prepared by a Sol-gel Method," Proceedings of SPIE—The International Society for Optical Engineering, v 4282, p. 193-199, 2001.
Ruge, Ingolf et al. "Halbleiter Technologie," Publication: Berlin; New York : Springer-Verlag; Edition: 2., überarbeitete und erw. Aufl. / von Hermann Mader. Year: 1984; Description: 404 p. : 218 ill. ; 24 cm.; Language: German; Series: Halbleiter-Elektronik ; Bd. 4; Variation: Halbleiter-Elektronik ;; Bd. 4. Standard No. ISBN: 0387126619 (U.S.); 9780387126616 (U.S.); 3540126619; 9783540126614; National Library: 831027150 LCCN: 85-106745.
Un, Y., et al., "Behavior of Various Organosilicon Molecules in PECVD Processes for Hydrocarbon-doped Silicon Oxide Films Diffusion and Defect Data Pt.B," Solid State Phenomena, v 124-126, n. Part 1, p. 347-350, 2007, Advances in Nanomaterials and Processing—IUMRS.
Takeda, S., et al., "Surface Modification of Sputtered SiO2 Thin Films by Metal Doping," Materials Research Society Symposium—Proceedings, v 750, p. 443-448, 2002.
Tajima, N., et al., "Carbon-doped Silicon Oxide Films with Hydrocarbon Network Bonds for Low-k Dielectrics, theoretical Investigations," Japanese Journal of Applied Physics, Part 1; Regular Papers and Short Notes and Review Papers, v 46, n9A.
Sabbah, H., "Thermal Grafting of Fluorinated Molecular Monolayers on Doped Amorphous Silicon Suffaces," Journal of Applied Physics, v 105, n 6, 2009.
Popov, V.P., et al., "Atomically Flat Surface of Hydrogen Transferred Si Film with Boron Delta Doped Layer," Meeting Abstracts, p. 526, 2005, 207th Meeting of the Electrochemical Society—Meeting Abstracts.
Osada, Yoshito, et al., "Plasma-polymerized Organosilioxane Membranes Prepared by Simultaneous Doping of 2 Molecules and the Effect on Liquid Permeability," Journal of Polymer Science, Part A-1, Polymer Chemistry, v 23, n 9, p. 2425-2439, Sep. 1985.
Li, Jiangtian, et al. "A Pre-modification-direct Synthesis Route for the Covalent Incorporation and Monomeric Dispersion of Hydrophobic Organic Chromophores, in Mesoporous Silica Films," Microporous and Mesoporous Materials, v 111, n 1-3, p. 150-156, Apr. 15, 2008.
International Search Report and Written Opinion mailed May 24, 2012 in International Application No. PCT/CN2011/001392.
Wang, C., et al., Photophysical Properties of Rare Earth (Eu3+, Sm3+, Tb3+) Complex Covalently Immobilized in Hybrid Si—O—B Xerogels, Journal of Fluorescence, 2011, pp. 1-9.
Smirnovam, I., et al., Investigation into the Surface Morphology of Nanosized Silicate and Hybrid Films by Optical and Atomic-Force Microscopy, Glass Physics and Chemistry, vol. 33, No. 4, 2007, pp. 306-314.
Edwards, M., "Screen-Print Selective Diffusions for High-Efficiency Industrial Silicon Solar Cells", Progress in Photovoltaics: Research and Applications, vol. 16, Issue 1, Jan. 2008, pp. 31-45.
Salami, J. "Diffusion Paste Development for Printable IBC and Bifacial Silicon Solar Cells", Conference Record of the 2006 IEEE 4th World Conference on Photovoltaic Energy Conversion, WCPEC-4, vol. 2, 2007, Article No. 4059888, pp. 1323-1325.

* cited by examiner

DOPANT INK COMPOSITIONS FOR FORMING DOPED REGIONS IN SEMICONDUCTOR SUBSTRATES, AND METHODS FOR FABRICATING DOPANT INK COMPOSITIONS

TECHNICAL FIELD

This document generally relates to dopant ink compositions for forming doped regions in semiconductor substrates and methods for fabricating such ink compositions, and more particularly relates to dopant ink compositions with reduced out-diffusion, improved room temperature stability, and/or reliable inkjet jetting and accurate substrate pattern printing, and methods for fabricating such ink compositions.

BACKGROUND

Conductivity-determining type impurity dopant compositions, such as borosilicates and phosphosilicates, are used extensively for doping semiconductor substrates to form pn junctions and contact areas. In some applications, the doped silicates are designed to perform other functions such as to serve as barrier regions, insulation regions, etc. In applications such as, for example, solar cells, it is desirable to dope the semiconductor substrate in a pattern having very fine lines or features.

In recent years, semiconductor production has utilized non-contact printers, such as ink-jet systems, to print doped silicates onto semiconductor substrates. Typically, the doped silicates are printed in desired areas and then thermally treated, such as by rapid thermal annealing, to cause the dopants to diffuse into the semiconductor substrates at the desired areas. However, dopants may diffuse beyond the desired areas into undesired areas during the process. This out-diffusion of dopants can significantly affect the electrical characteristics of the resulting semiconductor devices, particularly for those devices with doped patterns having very fine lines or features. Dopants having low out-diffusion are supposed to only dope the printed or coated area during high temperature annealing, without contaminating adjacent unprinted areas. If dopants are known to out-diffuse into adjacent unprinted areas, then an additional barrier pattern layer is needed to prevent the out-diffusion. Additional barrier pattern layers can significantly increase process complexity and cost.

Further, some dopant compositions for non-contact printing are not sufficiently room temperature stable and suffer from short shelf life. They may require refrigeration between their fabrication and their use. As a result, logistic, storage, and handling requirements for these dopant compositions can make their use cumbersome and uneconomical.

Accordingly, it is desirable to provide dopant ink compositions for forming doped regions in semiconductor substrates with reduced out-diffusion, and methods for fabricating such dopant ink compositions. In addition, it is desirable to provide dopant ink compositions for forming dopant regions in semiconductor substrates with increased stability at room temperature, and methods for fabricating such dopant ink compositions. Furthermore, other desirable features and characteristics will become apparent from the subsequent detailed description and the appended claims, taken in conjunction with the accompanying drawings and this background.

BRIEF SUMMARY

Dopant ink compositions for forming doped regions in semiconductor substrates and methods for fabricating dopant ink compositions are provided herein. In accordance with an exemplary embodiment, a dopant ink composition comprises a dopant-silicate carrier formed by a dopant compound and a silicon-containing compound. The dopant compound includes at least one alkyl group bonded to a Group 13 (modern IUPAC notation, formerly Group III) element or a Group 15 (modern IUPAC notation, formerly Group V) element. Further, the dopant compound and the silicon-containing compound are bonded together via a silicon-oxygen-dopant ion linkage. The dopant ink composition also includes at least one solvent.

In accordance with another exemplary embodiment, a dopant ink composition comprises a dopant compound including at least one alkyl group bonded to a Group 15 element. The dopant ink composition also includes a silicon-containing compound.

Another exemplary embodiment provides a method for fabricating dopant ink compositions for forming doped regions in a semiconductor substrate. In the method, a dopant compound including at least one alkyl group bonded to a Group 13 element or a Group 15 element is provided. Also, a silicon-containing compound is provided. The method includes mixing the dopant compound and the silicon-containing compound and forming a dopant-silicate carrier including silicon-oxygen-dopant ion linkages.

BRIEF DESCRIPTION OF THE DRAWINGS

Exemplary embodiments will hereinafter be described in conjunction with the following drawing figures, wherein like numerals denote like elements, and wherein.

DETAILED DESCRIPTION

The following detailed description is merely exemplary in nature and is not intended to limit the dopant ink composition described, the method for fabricating the composition, or the application and uses of the composition. Furthermore, there is no intention to be bound by any theory presented in the preceding background or the following detailed description.

Dopant ink compositions for forming doped regions in semiconductor substrates and methods for fabricating such dopant ink compositions are contemplated herein. The dopant ink compositions resist out-diffusion after being printed onto semiconductor substrates. Specifically, due to the unique molecular structure of the dopant compounds used, the dopant ink compositions herein prevent out-diffusion. Functionally, the structure of the dopant compound causes direct bonding to selective oligomers/polymers for film formation. Further, the dopant ink compositions herein are non-aqueous and are stable at room temperature for at least two weeks, without change in doping or process reliability. As used herein, an ink composition is "stable" at room temperature for at least two weeks when the ink composition's physical and process properties are unchanged at room temperature for at least two weeks. Also, the ink compositions herein are amenable to the use of a wide variety of solvents and additives for the adjustment of their doping performance and process windows. Due to their unique components, non-aqueous methods for fabricating the ink compositions do not rely on complicated synthetic processes and are comparatively less expensive.

In an exemplary embodiment, a dopant ink composition includes a dopant compound which, depending on the desired doping, contains at least one alkyl group bonded to a Group 13 element or a Group 15 element. For example, the dopant compound may be selected from among alkyl compounds of the Group 13 elements (boron, aluminum, gallium, indium, thallium) when p-type doping is desired, or may be selected from among alkyl compounds of the Group 15 elements (nitrogen, phosphorus, arsenic, antimony, bismuth and ununpentium) when n-type doping is desired. Preferably, the Group 13 element is boron and for p-type doping an alkyl borate is used. For n-type doping, the Group 15 element is preferably phosphorus and the dopant compound is an alkyl phosphate. In either case, the dopant element content in the phosphorous-silicate glass (PSG) or boron-silicate glass (BSG) is about 2 to about 15% by mass composition, preferably about 7 to about 10% by mass.

Figure 1:
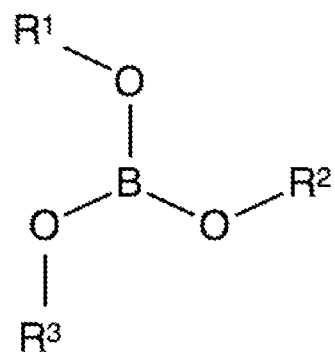
FIG. 1 is an illustration of the general molecular structure of a p-type dopant compound for use in an exemplary embodiment of a dopant ink composition.
Figure 2:
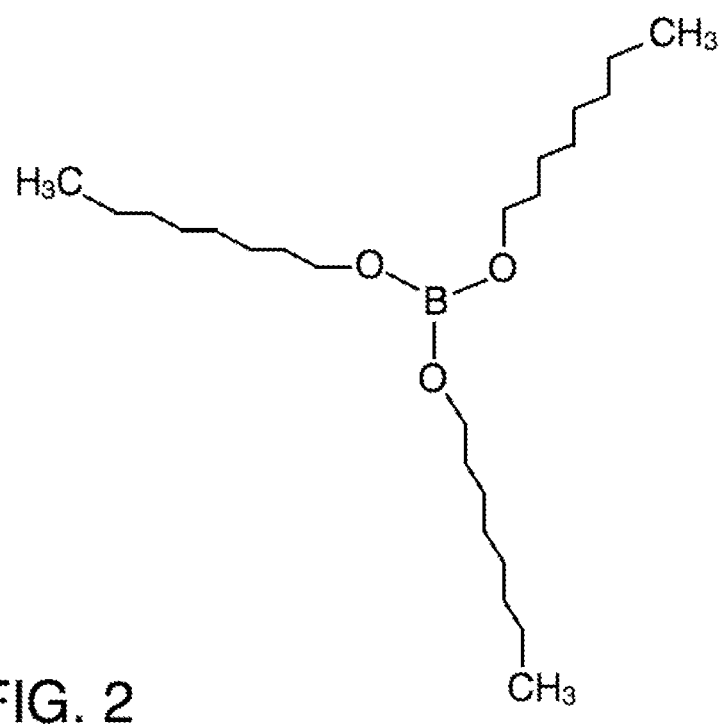
FIG. 2 is an illustration of the molecular structure of trioctyl borate for use as an exemplary p-type dopant compound.

FIG. 1 illustrates the general molecular structure of an exemplary alkyl borate. Alkyl borate includes a borate ion ($BO_3$), and at least one hydrocarbon group (R). As shown in FIG. 1, the preferred alkyl borate has a molecular formula of $(R^1O)B(OR^2)(OR^3)$, wherein each of $R^1$, $R^2$, and $R^3$ is a hydrogen or a hydrocarbon group having 1 to 20 carbon atoms. Preferably, each of $R^1$, $R^2$, and $R^3$ is a hydrocarbon group having 4 to 8 carbon atoms. An exemplary alkyl borate, trioctyl borate, is illustrated in FIG. 2 and has the formula $(C_8H_{17}O)_3B$.

Figure 3:
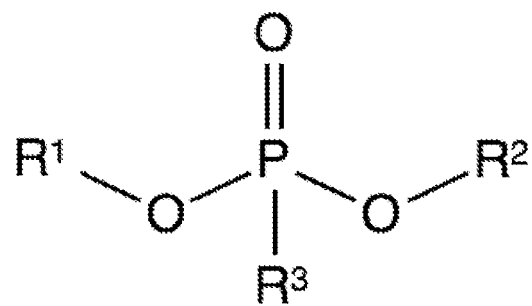
FIG. 3 is an illustration of the general molecular structure of an n-type dopant compound for use in an exemplary embodiment of a dopant ink composition.
Figure 4:
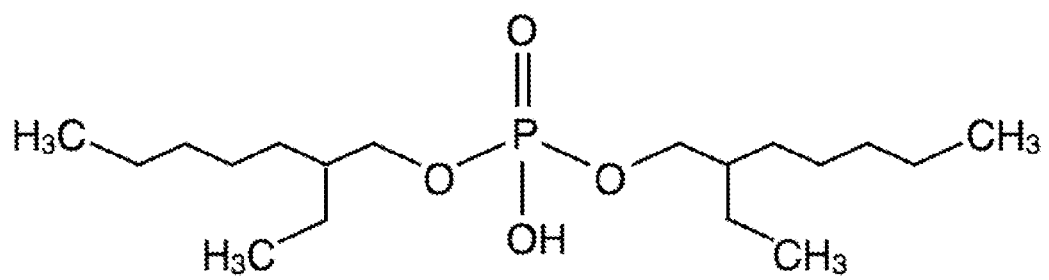
FIG. 4 is an illustration of the molecular structure of bis(2-ethylhexyl)phosphate for use as an exemplary n-type dopant compound.

FIG. 3 depicts the general molecular structure of an alkyl phosphate. As shown, the alkyl phosphate includes a phosphate ion ($PO_4$) and at least one hydrocarbon group (R). The alkyl phosphate has a molecular formula of $(R^1O)(R^2O)P(O)(OR^3)$, wherein each of $R^1$, $R^2$, and $R^3$ is a hydrogen or a hydrocarbon group having 1 to 20 carbon atoms. Preferably, each of $R^1$ and $R^2$ is a hydrocarbon group having 4 to 8 carbon atoms. In FIG. 4, a preferred alkyl phosphate, bis(2-ethylhexyl)phosphate or diiso-octyl phosphate, is illustrated and has the formula $(C_8H_{17}O)P(O)(OC_8H_{17})OH$. As can be seen from FIGS. 2 and 4, the alkyl groups in the dopant compound may be linear or branched.

Figure 5:
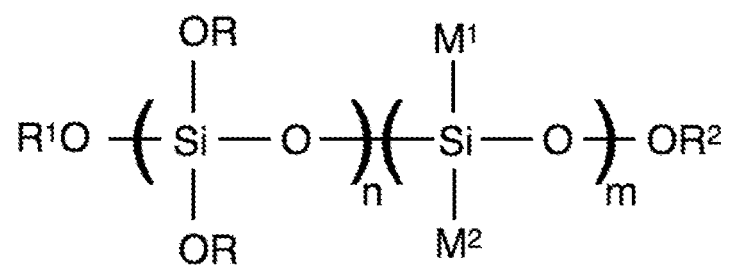
FIG. 5 is an illustration of the molecular structure of a silicon-containing compound for use in an exemplary embodiment of a dopant ink composition.

In addition to the dopant compound, an exemplary dopant ink composition includes a silicon-containing compound. As described in more detail below, the silicon-containing compound will serve as the carrier of the dopant compound in the composition. The term "silicon-containing compound" is used herein to encompass silicon- and oxygen-containing compounds including, but not limited to, silicate oligomers and polymers, including organosilicates, siloxanes, and silsesquioxanes. The silicon-containing compound is not particularly limited, and may be a conventionally well-known compound for forming a silicone-based coating on a semiconductor substrate such as, for example, those for use in forming an interlayer insulating film. Silicon-containing compounds which have been used in the production of semiconductors generally have an $(-O-Si-O-)_n$ skeleton. For the ink composition contemplated herein, the structure of exemplary silicon-containing compounds is illustrated in FIG. 5. As shown, an exemplary silicon-containing compound has a molecular formula of $R^1O(Si(OR)_2O)_n(M^1M^2SiO)_mOR^2$. In the formula, each of R, $R^1$, and $R^2$ is a hydrogen or a carbon group having 1 to 10 carbon atoms. Further, $M^1$ and $M^2$ each represent a hydrogen, a carbon group having 1 to 10 carbon atoms, or a hydroxyl or alkoxyl group having 1 to 10 carbon atoms.

In the silicon-containing compound, the structure of the groups may be either linear or branched. Further, the mass average molecular weight of the silicon-containing compound (in terms of the polystyrene equivalent according to gel permeation chromatography) is between about 500 to about 50,000, and preferably is between about 800 to about 8000. While the silicon-containing compound includes n and m silanol groups, generally fewer total silanol groups are preferred.

It also is desirable to minimize the drying rate of the dopant ink composition to minimize or eliminate clogging of printer nozzles, such as nozzles having dimensions as small as 10 nm, and to improve jettability. Thus, in an exemplary embodiment, the dopant ink composition includes a functional additive such as a solvent having a boiling point greater than 200° C. The high boiling point solvent may be any organic solvent as long as its boiling point is greater than 200° C. Suitable high boiling point solvents include light glycol ethers and/or alcohols. A preferred high boiling point solvent is tripropylene glycol n-butyl ether or decanol. The high boiling point solvent forms at least about 10% by mass of the ink composition, preferably at least about 20% by mass of the ink composition, and most preferably about 35% by mass of the ink composition.

To further improve printing performance in ink-jet printers, the dopant ink composition may include a second solvent having a boiling point greater than 140° C. The second solvent may be any organic solvent as long as its boiling point is greater than 140° C. and preferably lower than the boiling point of the high boiling point solvent. Suitable lower boiling point solvents include heavier glycol ethers and/or alcohols. A preferred second solvent is diethylene glycol monomethyl ether, octanol or iso-octanol. The second solvent forms at least about 10% by mass of the ink composition, preferably at least about 15% by mass of the ink composition, and most preferably about 30% by mass of the ink composition. The combination of the first and second solvents has been found to improve application properties of the ink composition. It is preferred that the solvents comprise at least about 50% of the ink composition by mass.

An exemplary ink composition further includes a surfactant. Functionally, the surfactant is provided in a minute amount to improve the coating property, flattening property, and/or spreading property of the ink composition. In one exemplary embodiment, the ink composition is formulated so that spreading of the ink composition when penned onto a semi-conductor substrate is minimized. In a preferred embodiment, the ink composition has a spreading factor in the range of from about 1.5 to about 6. The term "spreading factor" of a non-contact printing process ink is defined in terms of an inkjet printing process and is the ratio of the average diameter of a dot of the ink deposited by a nozzle of an inkjet printer to the diameter of the nozzle when the semiconductor substrate is at a temperature in a range of from 50° C. to about 60° C., the temperature of the ink at the nozzle is in a range of about 20° C. to about 22° C., the distance between the tip of the nozzle proximate to the substrate and the substrate is about 1.5 millimeters (mm) and the jetting frequency, that is, the number of ink drops jetted from the nozzle per second, is 2 kilohertz (kHz). By minimizing the spreading of the ink on the substrate, fine features, such as those having at least one feature that is less than about 200 μm or smaller, can be achieved.

The minute amount of surfactant does not significantly affect other properties of the ink composition, such as stability at room temperature. In exemplary embodiments, the surfactant may be silicone polyether acrylate, polyether siloxane copolymer, polyether modified polydimethylsiloxane, or fluoride surfactant. The surfactant comprises less than 500 ppm (parts per million) of the ink composition, and preferably about 200 ppm.

The dopant ink composition should meet at least one of several performance criteria for inkjet printing. First, the dopant ink composition is formulated so that it can be printed to form fine or small features, such as lines, dots, circles, squares, or other geometric shapes. In one exemplary embodiment, the dopant ink composition is formulated so that features having at least one dimension of less than about 200 μm can be printed. In another exemplary embodiment, the dopant ink composition is formulated so that features having at least one dimension less than about 100 μm can be printed. In a preferred embodiment, the dopant ink composition is formulated so that features having a dimension of less than about 20 μm can be printed. Second, during the printing process and during pausing of the printing process, the dopant ink composition experiences minimal, if any, clogging of the printer nozzles. Clogging of the nozzles results in down-time of the printer, thus reducing throughput. In one exemplary embodiment, the dopant ink composition has a viscosity in the range of about 1.5 to about 50 centipoise (cp). Further, the dopant ink composition is formulated so that, after it is deposited on the substrate and high-temperature annealing (discussed in more detail below) is performed, the resulting doped region has a sheet resistance in the range of about 10 to about 150 ohms/square (Ω/sq.). Moreover, the dopant ink composition is formulated so that the dopant and/or the dopant ink composition do not significantly out-diffuse to the undesired area. Significant out-diffusion of the dopant and/or the dopant ink composition from the desired area, either by vapor transport or by diffusion through the substrate during the process may significantly adversely affect the electrical properties of devices comprising the resulting doped regions. The dopant ink composition also is formulated so that significant diffusion of the dopant from the desired area into undesired areas during the annealing process is minimized or prevented altogether. In other words, localized doping, in contrast to blanket doping, is desirably effected. Significant diffusion of the dopant from the desired area into undesired areas, either by vapor transport or by diffusion through the substrate during the annealing process, should be minimized or eliminated so as to achieve localized doping without significantly changing the dopant distribution outside of the desired area.

Figure 6:
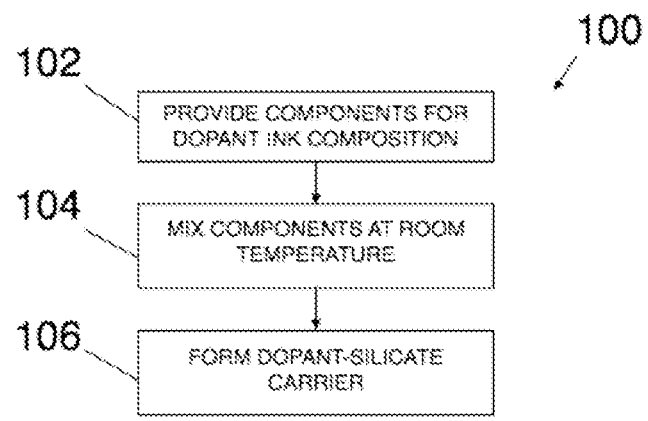
FIG. 6 is a flowchart of a method for fabricating a dopant ink composition in accordance with an exemplary embodiment.

Referring now to FIG. 6, in accordance with an exemplary embodiment, a method 100 for fabricating a dopant ink composition for forming doped regions in semiconductors includes the step of providing components including a dopant compound containing at least one alkyl group bonded to an ion of either a Group 13 or of a Group 15 element, a silicon-containing compound, a first solvent having a boiling point greater than 200° C., a second solvent having a boiling point greater than 140° C., and a surfactant (step 102). The method 100 further includes the step of mixing the components in a container at room temperature (step 104).

Figure 7:
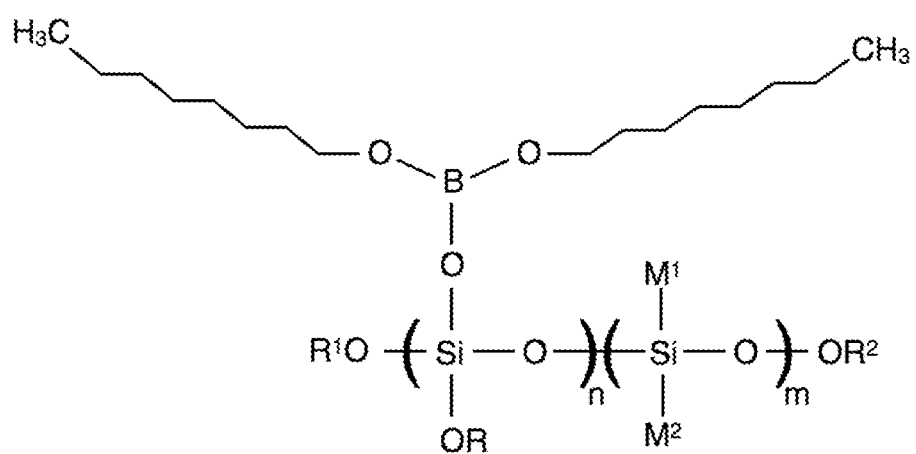
FIG. 7 is an illustration of the molecular structure of a p-type dopant-silicate in accordance with an exemplary embodiment.

Upon introduction and during mixing, the dopant compound and the silicon-containing compound interact and form a dopant-silicate carrier (step 106). An exemplary structure and bonding of a p-type dopant-silicate carrier is illustrated in FIG. 7. An exemplary structure and bonding of an n-type dopant-silicate carrier is illustrated in FIG. 8.

Figure 8:
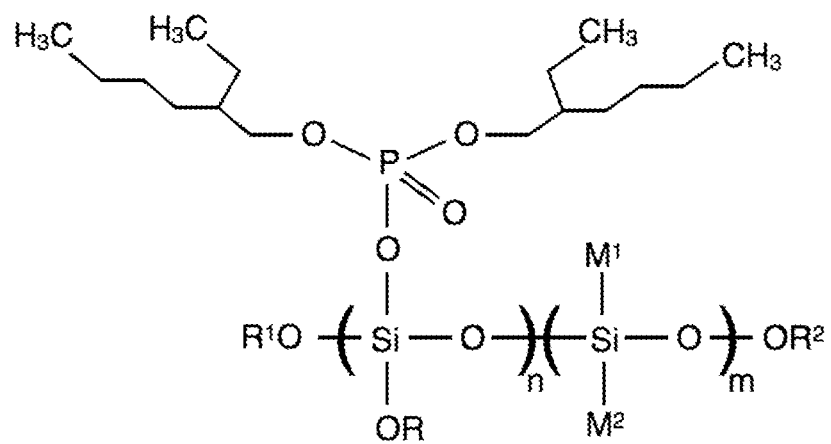
FIG. 8 is an illustration of the molecular structure of a n-type dopant-silicate in accordance with an exemplary embodiment.

As shown in FIGS. 7 and 8, the dopant-silicate carriers are formed by the dopant compound and the silicon-containing compound, which are bonded together via a silicon-oxygen-dopant ion linkage. As a result, each dopant-silicate carrier has a silicon-oxygen backbone structure. Due to the bonding interaction between the dopant compounds and the silicon-containing compound in the dopant-silicate carrier, stabilization and sintering of the dopants is facilitated, and, as a result, out-diffusion of the ink composition after printing is inhibited. Further, the dopant-silicate carrier may be a base or plate-form which may be modified with additives to formulate inkjet ink, screening printing paste, spin coating ink or other process compositions with specific desired characteristics.

It is noted that conventional ink compositions for forming doped regions in semiconductors require more complicated methods of fabrication. For instance, a typical conventional fabrication method includes mixing butanol, tetraethyl orthosilicate (TEOS), acetic anhydride, water, and phosphoric acid solution. The method further requires a reflux process for 2 hours at 90° C. to 100° C. After reflux, polydimethylsiloxane and tripropylene glycol n-butyl ether are added and mixed. Typically, this mixture is stored for about 18 hours before being refrigerated at 0° C. or less until use in ink-jet printing.

Figure 9:
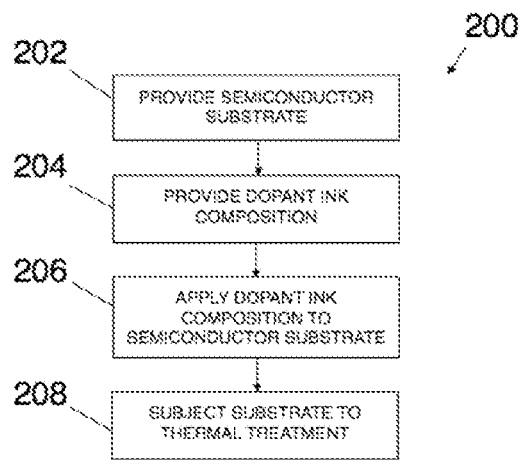
FIG. 9 is a flowchart of a method for forming doped regions in a semiconductor substrate with a dopant ink composition in accordance with an exemplary embodiment.

Referring to FIG. 9, a method 200 for forming doped regions in a semiconductor substrate includes the step of providing a semiconductor substrate (step 202). As used herein, the term "semiconductor substrate" will be used to encompass monocrystalline silicon materials, including the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor substrate" encompasses other semiconductor materials such as relatively pure and impurity-doped germanium, gallium arsenide, and the like. In this regard, the method 200 can be used to fabricate a variety semiconductor devices including, but not limited to, microelectronics, solar cells, displays, RFID components, microelectromechanical systems (MEMS) devices, optical devices such as microlenses, medical devices, and the like.

The method 200 further includes the step of providing a dopant ink composition with a conductivity-determining type impurity dopant compound (step 204), which step may be performed before, during or after the step of providing the semiconductor substrate. In accordance with an exemplary embodiment, the dopant ink composition comprises the appropriate conductivity-determining type impurity dopant compound that is required for the doping. For example, for forming n-type doped regions, the dopant compound comprises an alkyl of phosphorous, arsenic, antimony, or combinations thereof. For forming p-type doped regions, the dopant compound preferably comprises an alkyl of boron.

The ink composition is applied overlying the substrate using a non-contact printer (step 206). As used herein, the term "overlying" encompasses the terms "on" and "over". Accordingly, the ink composition can be applied directly onto the substrate or may be deposited over the substrate such that one or more other materials are interposed between the ink and the substrate. Examples of materials that may be interposed between the ink composition and the substrate are those materials that do not obstruct diffusion of the ink into the substrate during annealing. Such materials include phosphosilicate glass or borosilicate glass that forms on a silicon material during formation of p-well regions or n-well regions therein. Typically such silicate glass materials are removed by deglazing before dopants are deposited on the silicon material; however, in various embodiments, it may be preferable to omit the deglazing process, thereby permitting the silicate glass to remain on the substrate.

Figure 10:
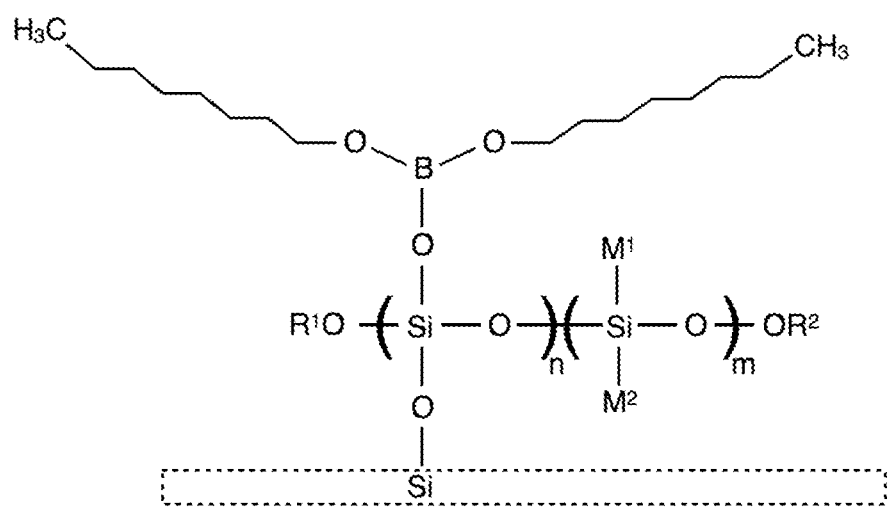
FIG. 10 is an illustration of a p-type dopant-silicate bonded to a semiconductor substrate in accordance with an exemplary embodiment.
Figure 11:
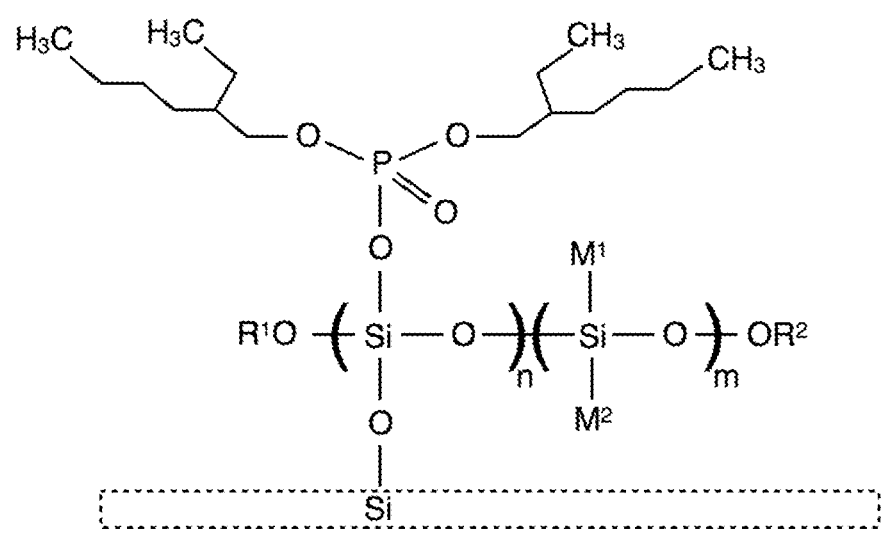
FIG. 11 is an illustration of an n-type dopant-silicate bonded to a semiconductor substrate in accordance with an exemplary embodiment.

The dopant ink composition is applied to the substrate in a pattern that is stored in or otherwise supplied to the non-contact printer. Preferably, the dopant ink composition is applied to the substrate at a temperature in the range of about 15° C. to about 80° C. in a humidity of about 20% to about 80%. Upon application, the dopant-silicate bonds to the semiconductor substrate. FIGS. 10 and 11 illustrate a possible bonding between the dopant-silicates and the silicone of the semiconductor substrate. The bonding may be valence or hydrogen bonding and occurs before diffusion to improve doping and the prevent out-diffusion before annealing.

As shown in FIG. 9, after the pattern of dopant ink composition is formed on the substrate, the substrate is subjected to a high-temperature thermal treatment or "anneal" to cause the dopant compound of the dopant ink composition to diffuse into the substrate, thus forming doped regions within the substrate in a predetermined or desired manner (step 208). The time duration and the temperature of the anneal is determined by such factors as the initial dopant compound concentration of the dopant ink composition, the thickness of the ink deposit, the desired concentration of the resulting dopant region, and the depth to which the dopant compound is to diffuse. The anneal can be performed using any suitable heat-generating method, such as, for example, infrared heating, laser heating, microwave heating, and the like. In one exemplary embodiment, the substrate is placed inside a furnace wherein the temperature is ramped up to a temperature in the range of about 850° C. to about 1100° C. and the substrate is baked at this temperature for about 2 to about 90 minutes. Annealing also may be carried out in an in-line furnace to increase throughput. The annealing atmosphere may contain 0 to 100% oxygen in an oxygen/nitrogen or oxygen/argon mixture. In a preferred embodiment, the substrate is subjected to an anneal temperature of about 950° C. for about thirty (30) minutes in a nitrogen ambient.

The following is an example of a dopant ink composition for use in forming doped regions of semiconductor substrates using non-contact printing processes. The example is provided for illustration purposes only and is not meant to limit the various embodiments herein in any way.

Example 1

| N-type Dopant Ink Composition | | |
|---|---|---|
| Dopant compound | Bis(2-ethylhexyl) Phosphate | 17.3% by mass |
| Silicon-containing compound | Polysiloxane | 29.7% by mass |
| First solvent | Tripropylene glycol n-butyl ether | 29.1% by mass |
| Second solvent | Diethylene glycol monomethyl ether | 23.9% by mass |
| Surfactant | Silicone polyether acrylate | 200 ppm |

Accordingly, dopant ink compositions and methods for fabricating dopant ink compositions have been provided. While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the dopant ink composition or method of fabrication in any way. Rather, the foregoing detailed description will provide those skilled in the art with a convenient road map for implementing an exemplary embodiment, it being understood that various changes may be made in the function and arrangement of elements described in an exemplary embodiment without departing from the scope as set forth in the appended claims and their legal equivalents.

What is claimed is:

1. A dopant ink composition comprising:
a dopant-silicate carrier formed by a dopant compound and a silicon-containing compound, wherein the dopant compound includes at least one alkyl group bonded to a a Group 15 element, and wherein the dopant compound and the silicon-containing compound are bonded together via a silicon-oxygen-dopant ion linkage; and
at least one solvent.

2. The dopant ink composition of claim 1 wherein the solvent is selected to formulate a product selected from the group consisting of inkjet ink, screen printing paste, and spin coating dopant.

3. The dopant ink composition of claim 1 wherein the dopant-silicate carrier and solvent form a non-aqueous mixture that is stable at room temperature for at least two weeks.

4. The dopant ink composition of claim 1 wherein the dopant compound is alkyl phosphate and has a molecular formula of:

$$(R^1O)(R^2O)P(O)(OR^3)$$

and wherein each of $R^1$, $R^2$, and $R^3$ is a hydrogen or a hydrocarbon group having 1 to 20 carbon atoms.

5. The dopant ink composition of claim 4 wherein each of $R^1$ and $R^2$ is a hydrocarbon group having 4 to 8 carbon atoms.

6. A dopant ink composition comprising:
a dopant compound including at least one alkyl group bonded to a Group 15 element; and
a silicon-containing compound.

7. The dopant ink composition of claim 6 wherein the dopant compound is alkyl phosphate and has a molecular formula of:

$$(R^1O)(R^2O)P(O)(OR^3)$$

and wherein each of $R^1$, $R^2$, and $R^3$ is a hydrogen or a hydrocarbon group having 1 to 20 carbon atoms.

8. The dopant ink composition of claim 7 wherein each of $R^1$ and $R^2$ is a hydrocarbon group having 4 to 8 carbon atoms.

9. The dopant ink composition of claim 6 wherein the silicon-containing compound has a molecular formula of:

$$R^1O(Si(OR)_2O)_n(M^1M^2SiO)_mOR^2$$

wherein each of R, $R^1$, and $R^2$ is a hydrogen or a carbon group having 1 to 10 carbon atoms; and wherein each of $M^1$ and $M^2$ is a hydrogen, a carbon group having 1 to 10 carbon atoms, or a hydroxyl or alkoxyl group having 1 to 10 carbon atoms.

10. The dopant ink composition of claim 9 wherein the silicon-containing compound has a molecular weight of about 500 to about 50000.

11. The dopant ink composition of claim 6 further comprising a first solvent having a boiling point greater than 200° C. and a second solvent having a boiling point greater than 140° C.

12. The dopant ink composition of claim 11 wherein the first solvent is tripropylene glycol n-butyl ether, and wherein the second solvent is diethylene glycol monomethyl ether.

13. The dopant ink composition of claim 6 further comprising a surfactant selected from the group consisting of silicone polyether acrylate, polyether siloxane copolymer, and polyether modified polydimethylsiloxane.

14. The dopant ink composition of claim 6 wherein the dopant compound and the silicon-containing compound are bonded together to form a carrier.

15. The dopant ink composition of claim 6 wherein the dopant compound and the silicon-containing compound are bonded together via silicon-oxygen-Group 15 element linkages.

16. The dopant ink composition of claim 6 wherein the Group 15 element is a phosphorus ion, and wherein the dopant compound and the silicon-containing compound are bonded together via silicon-oxygen-phosphorus linkages.

17. A method for fabricating a dopant ink composition for forming doped regions in a semiconductor substrate, the method comprising:
    providing a dopant compound including at least one alkyl group bonded to a a Group 15 element;
    providing a silicon-containing compound; and
    mixing the dopant compound and the silicon-containing compound and forming a dopant-silicate carrier including silicon-oxygen-dopant ion linkages.

18. The method of claim 17 wherein the mixing step includes adding a solvent to form a non-aqueous mixture including the dopant-silicate carrier.

* * * * *